(12) United States Patent
Hata et al.

(10) Patent No.: US 8,427,042 B2
(45) Date of Patent: Apr. 23, 2013

(54) LIGHT-EMITTING DEVICE AND METHOD FOR MANUFACTURING LIGHT-EMITTING DEVICE

(75) Inventors: Toshio Hata, Osaka (JP); Nobuaki Aoki, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 149 days.

(21) Appl. No.: 12/502,691

(22) Filed: Jul. 14, 2009

(65) Prior Publication Data
US 2010/0013373 A1      Jan. 21, 2010

(30) Foreign Application Priority Data

Jul. 18, 2008   (JP) ................................. 2008-187584
Apr. 24, 2009   (JP) ................................. 2009-105999

(51) Int. Cl.
*H01J 1/62*        (2006.01)

(52) U.S. Cl.
USPC ............................................ 313/502; 445/58

(58) Field of Classification Search .................. 445/23, 445/58; 313/486, 487, 502, 503
See application file for complete search history.

(56) References Cited

U.S. PATENT DOCUMENTS

| 2002/0037478 A1* | 3/2002 | Kimura et al. ............... 430/321 |
| 2004/0149958 A1 | 8/2004 | Chua |
| 2006/0169998 A1 | 8/2006 | Radkov et al. |
| 2006/0226759 A1* | 10/2006 | Masuda et al. ............... 313/486 |
| 2007/0046169 A1* | 3/2007 | Maeda et al. ................. 313/487 |
| 2008/0180948 A1 | 7/2008 | Yoon et al. |
| 2008/0197376 A1* | 8/2008 | Bert et al. ....................... 257/99 |
| 2009/0267484 A1 | 10/2009 | Kasakura et al. |

FOREIGN PATENT DOCUMENTS

| JP | 10-36827 | 2/1998 |
| JP | 10-118666 | 5/1998 |
| JP | 2004-281432 | 10/2004 |
| JP | 2006-321966 | 11/2006 |
| JP | 2007-180483 | 7/2007 |
| JP | 2008-150518 | 7/2008 |
| JP | 2008-166825 | 7/2008 |
| JP | 2008-198951 | 8/2008 |
| WO | WO-2007/100824 | 9/2007 |
| WO | WO-2008/001799 | 1/2008 |

* cited by examiner

*Primary Examiner* — Anh Mai
*Assistant Examiner* — Andrew Coughlin
(74) *Attorney, Agent, or Firm* — Morrison & Foerster LLP

(57) ABSTRACT

A light-emitting device has a structure in which a light-emitting element is placed on a wiring pattern, with the wiring pattern and an upper portion of the light-emitting element being connected with each other by a bonding wire, and has a feature in that a phosphor kneaded matter, obtained from a phosphor kneaded matter packaging container, is sealed on the wiring pattern and the light-emitting element by a sealing resin. With this structure, it becomes possible to emit white light with high efficiency and consequently to obtain white light that is remarkably superior in color reproducibility (NTSC ratio).

13 Claims, 12 Drawing Sheets

LIGHT-EMITTING DEVICE AND METHOD FOR MANUFACTURING LIGHT-EMITTING DEVICE

This nonprovisional application is based on Japanese Patent Application No. 2008-187584 filed on Jul. 18, 2008 and No. 2009-105999 filed on Apr. 24, 2009 with the Japan Patent Office, the entire contents of which are hereby incorporated by reference.

BACKGROUND OF THE INVENTION

1. Field of the Invention

The present invention relates to a light-emitting device provided with a phosphor kneaded matter obtained from a phosphor kneaded matter packaging container in which a phosphor and resin and the like are kneaded, and a method for manufacturing the same.

2. Description of the Background Art

A light-emitting device in which a semiconductor light-emitting element and a phosphor are combined with each other has drawn public attentions as a light-emitting device of the next generation that can achieve low power-consumption, small-size and high-luminance, as well as color reproducibility in a wide range, and researches and developments have been vigorously carried out thereon. Here, primary light to be emitted from the light-emitting element is normally selected from a long wavelength range from ultraviolet rays to blue rays, that is, from 380 to 480 nm, and is utilized. Moreover, wavelength converting units using various phosphors suitable for this application have been proposed.

With respect to a tetravalent manganese-activated fluoride metal salt phosphor, for example, U.S. Patent Application Publication No. 2006/0169998 has described its manufacturing method, and although U.S. Patent Application Publication No. 2006/0169998 has described its combination with a green phosphor having higher efficiency, no description has been given to the color reproducibility (NTSC ratio) thereof.

A red-color narrow band fluoride phosphor (KTF) exerts a red-color light emission with a peak wavelength of 635 nm and a spectrum half width of $\lambda\frac{1}{2}=10$ nm, which is extremely narrow, and has desirable light-emission characteristics for use in display applications; however, the fluoride phosphor (KTF) has a problem in that, when used as powder, it dissolves in water (solubility: about 1%) to generate hydrofluoric acid. When the powder is inhaled, bad effects are caused in the human body; therefore, sufficient cautions are required in handling the powder.

SUMMARY OF THE INVENTION

The present invention relates to a light-emitting device that is provided with a light-emitting element placed on a wiring pattern, with the wiring pattern and an upper portion of the light-emitting element being connected to each other by a bonding wire, and has a feature in that a phosphor kneaded matter obtained from a phosphor kneaded matter packaging container is sealed on the wiring pattern and the light-emitting element by a sealing resin.

In the light-emitting device of the present invention, preferably, the phosphor kneaded matter contains a transparent resin and a red phosphor, and is sealed together with a green phosphor by the sealing resin.

In the light-emitting device of the present invention, preferably, the phosphor kneaded matter contains a transparent resin, a red phosphor and a green phosphor.

In the light-emitting device of the present invention, preferably, the phosphor kneaded matter contains a red phosphor coated with a transparent resin and a coating resin, and is sealed together with a green phosphor by the sealing resin.

In the light-emitting device of the present invention, preferably, the phosphor kneaded matter contains a primer and a red phosphor, and is sealed together with a green phosphor by the sealing resin.

In the light-emitting device of the present invention, preferably, the phosphor kneaded matter contains a red phosphor coated with a transparent resin and a primer, and is sealed together with a green phosphor by the sealing resin.

In the light-emitting device of the present invention, preferably, the phosphor kneaded matter contains a transparent resin, a red phosphor and a green phosphor coated with a primer.

In the light-emitting device of the present invention, preferably, the transparent resin contains at least one material selected from the group consisting of a dispersant, a reflective agent and a scattering agent.

In the light-emitting device of the present invention, preferably, uppermost layers of a pad electrode, a bonding wire and a wiring pattern on a light-emitting element that are made in contact with the sealing resin that seals the phosphor kneaded matter are made of a platinum layer or a gold layer.

In the light-emitting device of the present invention, preferably, the red phosphor is a tetravalent manganese-activated tetravalent fluoride metal salt phosphor.

In the light-emitting device of the present invention, preferably, the phosphor kneaded matter further contains a calcium compound.

In the light-emitting device of the present invention, preferably, the phosphor kneaded matter packaging container and the phosphor kneaded matter are made in contact with each other, with a contact face thereof being made from a polymer material.

In the light-emitting device of the present invention, preferably, the phosphor kneaded matter packaging container is a tube-shaped tube packaging container or a tube-shaped container.

In the light-emitting device of the present invention, preferably, the phosphor kneaded matter packaging container further includes a calcium compound therein.

In the light-emitting device of the present invention, preferably, the calcium compound is at least one kind selected from the group consisting of calcium gluconate, calcium borogluconate, calcium glycerophosphate, calcium chloride, calcium lactate, calcium propionate, calcium pantothenate, calcium citrate, and calcium hydrogenphosphate.

A method for manufacturing the light-emitting device of the present invention in which a light-emitting element is placed on a wiring pattern, with the wiring pattern and an upper portion of the light-emitting element being connected with each other by a bonding wire, includes the step of: sealing a phosphor kneaded matter obtained from a phosphor kneaded matter packaging container on the wiring pattern and the light-emitting element by using a sealing resin.

The phosphor kneaded matter packaging container of the present invention makes it possible to prevent scattering of tetravalent manganese-activated fluoride tetravalent metal salt phosphor that can emit white light with high efficiency and also provide white light that is remarkably superior in color reproducibility (NTSC ratio) and also to block moisture therefrom, and the resulting effect is that a reaction between the phosphor and moisture is suppressed so that generation of hydrofluoric acid is suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The following description will discuss the present invention in more detail by means of embodiments and examples; however, the present invention is not intended to be limited thereby.

The following description will discuss a light-emitting device manufactured by using a phosphor kneaded matter taken out of phosphor kneaded matter packaging container.

(Embodiment 1)

Figure 1:
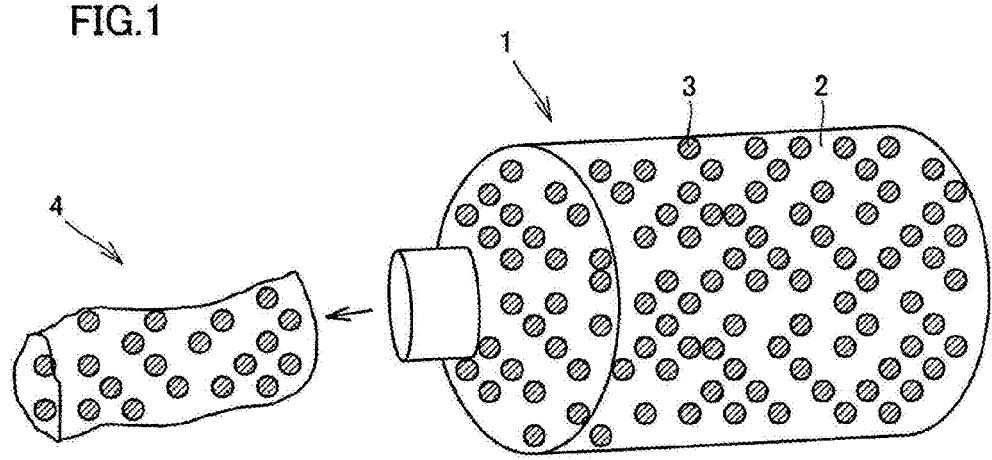
FIG. 1 is a schematic view that shows a phosphor kneaded matter packaging container and a phosphor kneaded matter containing a transparent resin and a red phosphor used for manufacturing a light-emitting device in accordance with one embodiment of the present invention.
Figure 2:
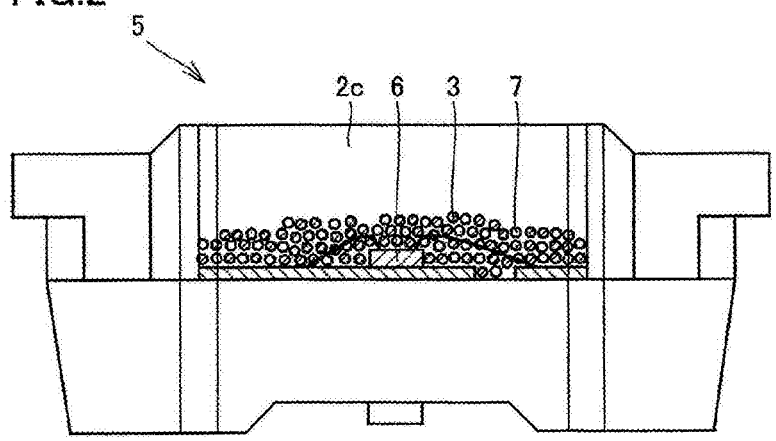
FIG. 2 is a cross-sectional view that shows the light-emitting device in accordance with the embodiment of the present invention.

Referring to FIGS. 1 and 2, the following description will discuss embodiment 1.

FIG. 1 is a schematic view that shows a phosphor kneaded matter packaging container 1 and a phosphor kneaded matter 4 containing a transparent resin 2 and a red phosphor 3 used for manufacturing a light-emitting device 5 in accordance with one embodiment of the present invention. FIG. 2 shows light-emitting device 5 in which a light-emitting element 6 is placed on a wiring pattern, with the wiring pattern and the upper portion of light-emitting element 6 being connected with each other by a bonding wire, and phosphor kneaded matter 4 containing transparent resin 2 and red phosphor 3, obtained from phosphor kneaded matter packaging container 1, and a green phosphor 7 are sealed on the wiring pattern and the light-emitting element with a sealing resin 2c.

As light-emitting element 6 used for light-emitting device 5 of the present embodiment, although not particularly limited, a gallium nitride (GaN)-based semiconductor that emits primary light in a blue region having a peak wavelength of 430 to 480 nm (more preferably, 440 to 480 nm) is preferably used. This is because, when a light-emitting element having a peak wavelength of less than 430 nm is used, the contribution of the blue light component becomes smaller to cause degradation of the color demonstrating characteristic to fail to be applicable for practical use, and because, when a light-emitting element having a peak wavelength exceeding 480 nm is used, brightness in white color deteriorates to fail to be applicable for practical use.

Here, transparent resin 2 and red phosphor 3 are taken out of phosphor kneaded matter packaging container 1 as phosphor kneaded matter 4 and used. The taking-out process of phosphor kneaded matter 4 need not to be carried out under special. conditions because moisture that might be made in contact with red phosphor 3 is blocked by transparent resin 2;

however, in order to completely block moisture therefrom, the process is more preferably carried out in a nitrogen atmosphere. A mixed matter containing green phosphor 7 and red phosphor 3 at a compounding ratio of 30:70 (weight ratio) is dispersed in a silicone resin (ratio of the silicone resin and the phosphor: 1.00:0.25) so that a wavelength converting unit is formed. Thus, light-emitting device 5 is manufactured.

For example, phosphor kneaded matter 4 is prepared by mixing 3.33 g of a silicone resin (agent A (main agent)) having a viscosity of 13500 mP·s with 5.00 g of a red phosphor by using a high-speed rotating device. The viscosity of the resulting red phosphor kneaded matter is set to 20000 mP·s or more.

To 0.840 g of the red phosphor kneaded matter are added 1.58 g of the silicone resin (agent A (main agent)) having a viscosity of 13500 mP·s, 2.00 g of a silicone resin (agent B (curing agent)) having a viscosity of 35 mP·s and 0.180 g of a green phosphor indicated by a compounding ratio of $Eu_{0.05}Si_{11.50}Al_{0.50}O_{0.05}N_{15.95}$ (β-type SiAlON) (median diameter: 12.0 μm) and mixed therein, and by using this mixture, a wavelength converting unit is formed so that light-emitting device 5 shown in FIG. 2 is manufactured. Here, as the light-emitting element, a gallium nitride (GaN)-based semiconductor having a peak wavelength at 450 nm is used.

Examples of transparent resin 2 include silicone resin, epoxy resin, urethane resin, norbornane resin, fluorine resin, metal alkoxide, polysilazane, acrylic resin, low-melting point glass and the like. Transparent resin 2 preferably contains at least one or more kinds of materials selected from the group consisting of a dispersant, a reflecting agent, and a scattering agent. As the dispersant, reflecting agent, and scattering agent, barium titanate, titan oxide, aluminum oxide, silicon oxide and the like are preferably used.

Examples of red phosphor 3 include $K_2(Ti_{0.99}Mn_{0.01})F_6$, $K_2(Ti_{0.9}Mn_{0.1})F_6$, $K_2(Ti_{0.999}Mn_{0.001})F_6$, $Na_2(Zr_{0.98}Mn_{0.02})F_6$, $Cs_2(Si_{0.95}Mn_{0.05})F_6$, $Cs_2(Sn_{0.98}Mn_{0.02})F_6$, $K_2(Ti_{0.88}Zr_{0.10}Mn_{0.02})F_6$, $Na_2(Ti_{0.75}Sn_{0.20}Mn_{0.05})F_6$, $Cs_2(Ge_{0.999}Mn_{0.001})F_6$, and $(K_{0.80}Na_{0.20})_2(Ti_{0.69}Ge_{0.30}Mn_{0.01})F_6$; however, of course, the present invention is not intended to be limited by these. Moreover, examples thereof also include $Zn(Ti_{0.98}Mn_{0.02})F_6$, $Ba(Zr_{0.995}Mn_{0.005})F_6$, $Ca(Ti_{0.995}Mn_{0.005})F_6$, and $Sr(Zr_{0.98}Mn_{0.02})F_6$; however, of course, the present invention is not intended to be limited by these.

Examples of green phosphor 7 include $Eu_{0.05}Si_{11.50}Al_{0.50}O_{0.05}N_{15.95}$, $Eu_{0.10}Si_{11.00}Al_{1.00}O_{0.10}N_{15.90}$, $Eu_{0.30}Si_{9.80}Al_{2.20}O_{0.30}N_{15.70}$, $Eu_{0.15}Si_{10.00}Al_{2.00}O_{0.20}N_{15.80}$, $Eu_{0.01}Si_{11.60}Al_{0.40}O_{0.01}N_{15.99}$, and $Eu_{0.005}Si_{11.70}Al_{0.30}O_{0.03}N_{15.97}$; however, of course, the present invention is not intended to be limited by these. Moreover, examples thereof also include $2(Ba_{0.70}Sr_{0.26}Eu_{0.04})\cdot SiO_2$, $2(Ba_{0.57}Sr_{0.38}Eu_{0.05})O\cdot SiO_2$, $2(Ba_{0.53}Sr_{0.43}Eu_{0.04})O\cdot SiO_2$, $2(Ba_{0.82}Sr_{0.15}Eu_{0.03})O\cdot SiO_2$, $2(Ba_{0.46}Sr_{0.49}Eu_{0.05})O\cdot SiO_2$, $2(Ba_{0.59}Sr_{0.35}Eu_{0.06})O\cdot SiO_2$, $2(Ba_{0.52}Sr_{0.40}Eu_{0.08})O\cdot SiO_2$, $2(Ba_{0.85}Sr_{0.10}Eu_{0.05})O\cdot SiO_2$, $2(Ba_{0.47}Sr_{0.50}Eu_{0.03})O\cdot SiO_2$, $2(Ba_{0.54}Sr_{0.36}Eu_{0.10})O\cdot SiO_2$, $2(Ba_{0.69}Sr_{0.25}Ca_{0.02}Eu_{0.04})O\cdot SiO_2$, $2(Ba_{0.56}Sr_{0.38}Mg_{0.01}Eu_{0.05})O\cdot SiO_2$, and $2(Ba_{0.81}Sr_{0.13}Mg_{0.01}Ca_{0.01}Eu_{0.04})O\cdot SiO_2$; however, of course, the present invention is not intended to be limited by these.

When it is taken into consideration that hydrofluoric acid is generated by a reaction between the phosphor and moisture, the material for the packaging container is preferably formed by polyethylene or polytetrafluoroethylene that is not eroded by hydrofluoric acid at least on its face to be made in contact with the phosphor kneaded matter. Moreover, the entire packaging container is preferably formed by polyethylene or polytetrafluoroethylene.

The shape of the packaging container is preferably formed into a tube packaging container having a tube shape or a tube-shaped container so as to form the inside of the packaging container into a multilayer structure. This shape is considered to be a simple optimal shape to be used when, upon pressurizing the outside of the packaging container, the material filled in the outermost portion is allowed to coat the member in the center portion of the packaging container.

When it is taken into consideration that hydrofluoric acid is generated by a reaction between the red phosphor and moisture, the wiring pattern is preferably made of platinum.gold. Moreover, the outermost surface of the pad electrode of semiconductor element 6 is preferably made of platinum.gold.

As sealing resin 2c, epoxy resin, silicone resin, urea resin and the like, which are resin materials having a light-transmitting property, may be used, although not particularly limited thereby. Moreover, in addition to the above-mentioned phosphor and sealing resin, the wavelength converting unit may of course contain additives, such as $SiO_2$, $TiO_2$, $ZrO_2$, $Al_2O_3$ and $Y_2O_3$, on demand, within a range that does not impair the effects of the present invention.

The other structures of light-emitting device 5 of the present embodiment are not particularly limited as long as it is allowed to exert the above-mentioned features.

(Embodiment 2)

Figure 3:
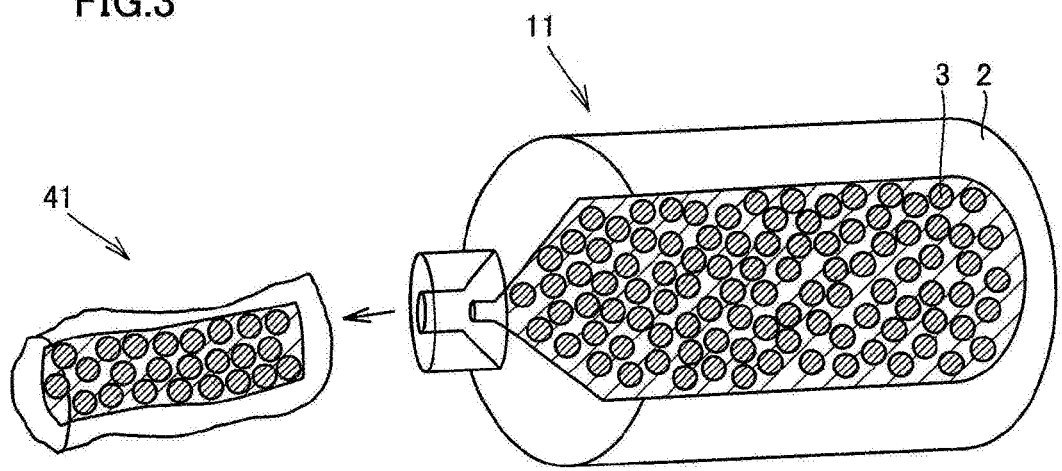
FIG. 3 is a schematic view that shows a phosphor kneaded matter packaging container and a phosphor kneaded matter having a two-layer structure containing a transparent resin and a red phosphor used for manufacturing a light-emitting device in accordance with one embodiment of the present invention.
Figure 4:
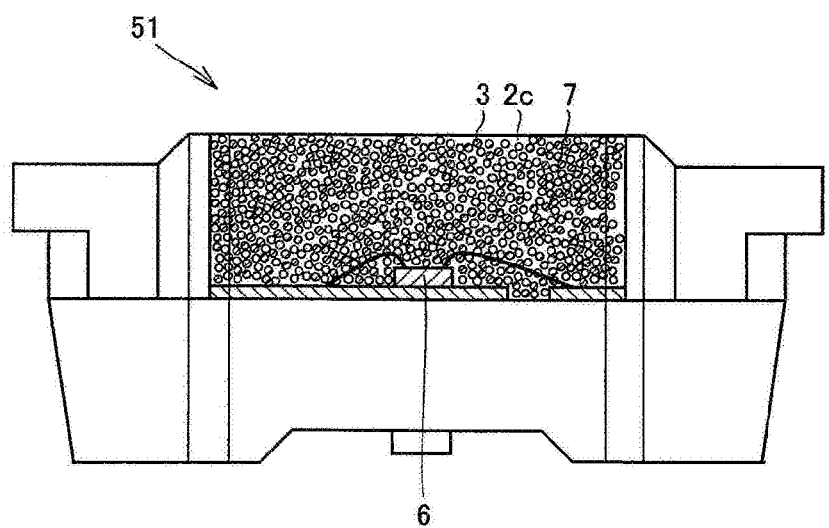
FIG. 4 is a cross-sectional view that shows a light-emitting device in accordance with the embodiment of the present invention.

Referring to FIGS. 3 and 4, the following description will discuss embodiment 2.

FIG. 3 is a schematic view that shows a phosphor kneaded matter packaging container 11 and a phosphor kneaded matter 41 having a two-layer structure containing a transparent resin 2 and a red phosphor 3 used for manufacturing a light-emitting device in accordance with one embodiment of the present invention. FIG. 4 shows a light-emitting device in which a light-emitting element 6 is placed on a wiring pattern, with the wiring pattern and the upper portion of light-emitting element 6 being connected with each other by a bonding wire, and phosphor kneaded matter 41 containing transparent resin 2 and red phosphor 3, obtained from phosphor kneaded matter packaging container 11, and a green phosphor 7 are sealed on the wiring pattern and light-emitting element 6 with a sealing resin 2c.

A gallium nitride (GaN)-based semiconductor having a peak wavelength at 450 nm is used as light-emitting element 6.

A phosphor kneaded matter of red phosphor 3 covered with transparent resin 2 is taken out of phosphor kneaded matter packaging container 11 as phosphor kneaded matter 41 and used.

Phosphor kneaded matter 41 generated from phosphor kneaded matter packaging container 11 has its inner layer, made from red phosphor 3, covered with an outer layer made from transparent resin 2; therefore, scattering of red phosphor 3 is prevented, and moisture is blocked therefrom, and the resulting effect is that a reaction between red phosphor 3 and moisture is suppressed so that generation of hydrofluoric acid is suppressed.

Moreover, since transparent resin 2 and red phosphor 3 are not mixed with each other inside phosphor kneaded matter packaging container 11, an effect for preventing precipitation of red phosphor 3 can be obtained. In a state where a phosphor is kneaded in resin, a problem arises in which the phosphor is precipitated in the packaging container; however, when the resin and the phosphor are placed therein in a separate manner as shown in the present embodiment, it becomes possible to reduce the problem with precipitation.

Examples of transparent resin 2 forming the tube outer layer include: silicone resin, epoxy resin, urethane resin, norbornane resin, fluorine resin, metal alkoxide, polysilazane, acrylic resin, low-melting point glass and the like.

The same material as that of embodiment 1 may be used as a material for red phosphor 3.

A mixed matter containing green phosphor 7 and red phosphor 3 at a compounding ratio of 30:70 (weight ratio) is dispersed in a sealing resin (a ratio of the sealing resin and the phosphor is set to 1.00:0.25) so that a wavelength converting unit is formed. Thus, a light-emitting device 51 is manufactured.

The same materials as those of embodiment 1 may be used as materials for light-emitting element 6 and sealing resin 2c.

The same material as that of embodiment 1 may be used as a material for green phosphor 7.

(Embodiment 3)

Figure 5:
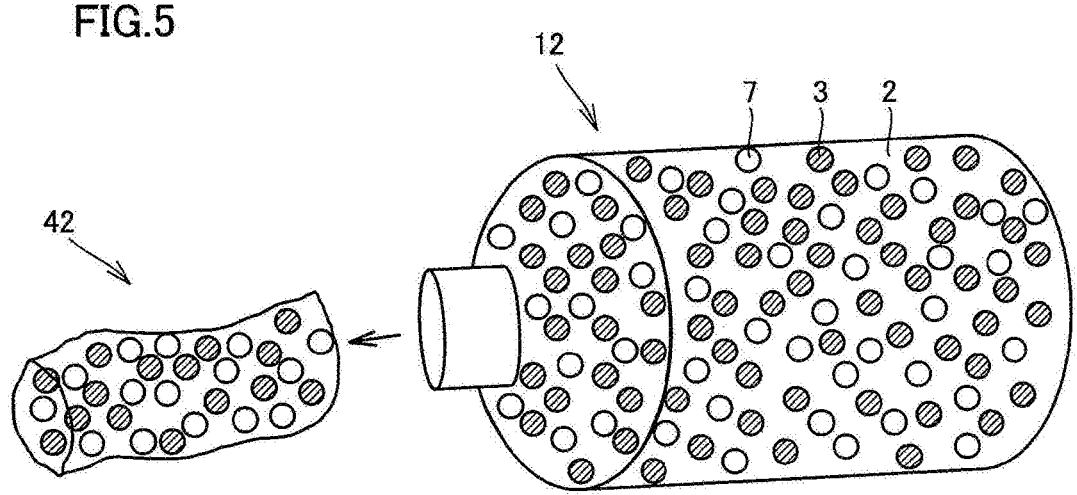
FIG. 5 is a schematic view that shows a phosphor kneaded matter packaging container and a phosphor kneaded matter containing a transparent resin, a green phosphor and a red phosphor used for manufacturing a light-emitting device in accordance with one embodiment of the present invention.
Figure 6:
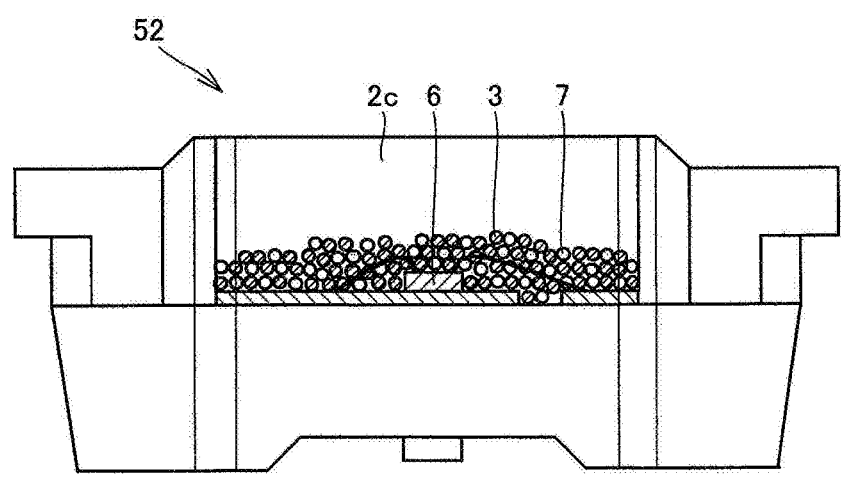
FIG. 6 is a cross-sectional view that shows a light-emitting device in accordance with the embodiment of the present invention.

Referring to FIGS. 5 and 6, the following description will discuss embodiment 3.

FIG. 5 is a schematic view that shows a phosphor kneaded matter packaging container 12 and a phosphor kneaded matter 42 containing a transparent resin 2, a green phosphor 7, and a red phosphor 3 used for manufacturing a light-emitting device in accordance with one embodiment of the present invention. FIG. 6 shows a light-emitting device 52 in which a light-emitting element 6 is placed on a wiring pattern, with the wiring pattern and the upper portion of light-emitting element 6 being connected with each other by a bonding wire, and phosphor kneaded matter 42 containing transparent resin 2, red phosphor 3, and green phosphor 7, obtained from phosphor kneaded matter packaging container 12, is sealed on the wiring pattern and light-emitting element 6 with a sealing resin 2c.

Here, a phosphor kneaded matter 42, formed by kneading red phosphor 3 and green phosphor 7 in transparent resin 2 inside the tube, is taken out from phosphor kneaded matter packaging container 12 as phosphor kneaded matter 42 and used.

Since green phosphor 7 and red phosphor 3 are blended in transparent resin 2 at desired ratios as the phosphors, a phosphor having a desired chromaticity (in other words, a white light-emitting device) can be obtained. For this reason, no weighing processes are required for the green phosphor and the red phosphor upon forming the light-emitting device.

Since phosphor kneaded matter 42, produced by phosphor kneaded matter packaging container 12, is composed of transparent resin 2, red phosphor 3 and green phosphor 7, scattering of red phosphor 3 is prevented, and moisture is blocked therefrom, and the resulting effect is that a reaction between red phosphor 3 and moisture is suppressed so that generation of hydrofluoric acid is suppressed.

The same material as that of embodiment 1 may be used as a material for red phosphor 3.

Examples of transparent resin 2 include: silicone resin, epoxy resin, urethane resin, norbornane resin, fluorine resin, metal alkoxide, polysilazane, acrylic resin, low-melting point glass and the like.

Green phosphor 7 and red phosphor 3 in phosphor-knead matter 42 are mixed with each other at a compounding ratio of 30:70 (weight ratio), and preliminarily dispersed in a sealing resin (ratio of the sealing resin and the phosphor: 1.00:0.25). Thus, light-emitting device 52 is manufactured.

The same materials as those of embodiment 1 may be used as materials for light-emitting element 6 and sealing resin 2c.

(Embodiment 4)

Figure 7:
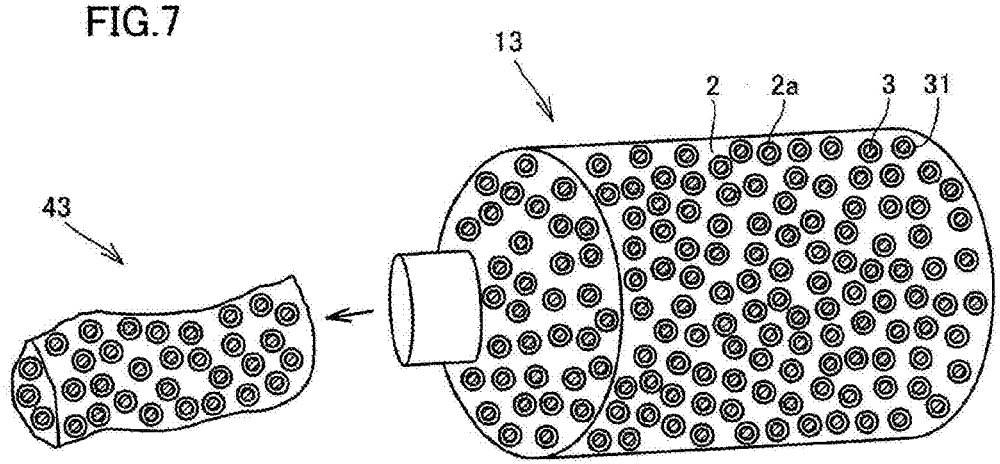
FIG. 7 is a schematic view that shows a phosphor kneaded matter packaging container and a phosphor kneaded matter containing a transparent resin and a red phosphor covered with a thermoplastic resin used for manufacturing a light-emitting device in accordance with one embodiment of the present invention.
Figure 8:
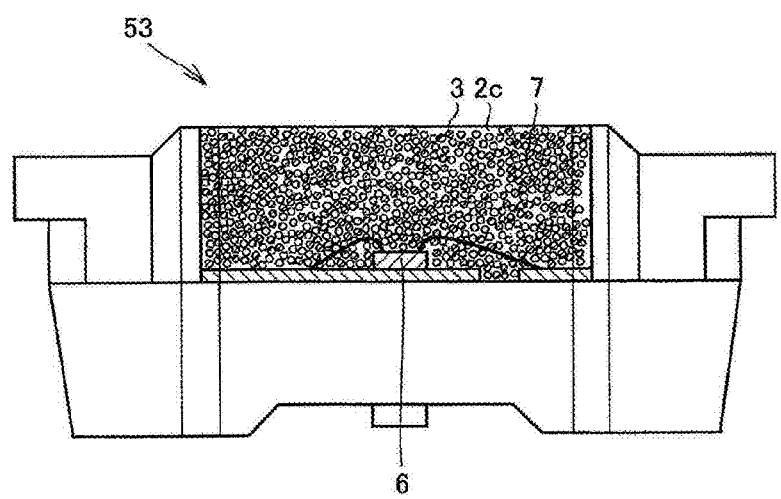
FIG. 8 is a cross-sectional view that shows a light-emitting device in accordance with the embodiment of the present invention.

Referring to FIGS. 7 and 8, the following description will discuss embodiment 4.

FIG. 7 is a schematic view that shows a phosphor kneaded matter packaging container 13 and a phosphor kneaded matter 43 containing a transparent resin 2 and phosphor resin particles 31 corresponding to a red phosphor 3 coated with a coating resin 2a that are used for manufacturing a light-emitting device in accordance with one embodiment of the present invention. FIG. 8 shows a light-emitting device 53 in which a light-emitting element 6 is placed on a wiring pattern, with the wiring pattern and the upper portion of light-emitting element 6 being connected with each other by a bonding wire, and phosphor kneaded matter 43 containing transparent resin 2 and phosphor resin particles 31 serving as red phosphor 3 coated with coating resin 2a, obtained from phosphor kneaded matter packaging container 13, as well as green phosphor 7 are sealed on the wiring pattern and light-emitting element 6 with sealing resin 2c.

Here, with respect to phosphor kneaded matter 43, phosphor resin particles 31 corresponding, formed by allowing transparent resin 2 and red phosphor 3 to be coated with coating resin 2a in a tube, are taken out from phosphor kneaded matter packaging container 13 as phosphor kneaded matter 43 and used. In this case, red phosphor 3 is exemplified as a phosphor the entire surface of which is coated with coating resin 2a; however, at least one portion of red phosphor 3 may be coated with a thermoplastic resin.

Since phosphor kneaded matter 43, generated from phosphor kneaded matter packaging container 13, is composed of red phosphor 3 the entire surface of which is coated with coating resin 2a, that is, phosphor resin particles 31 and transparent resin 2, scattering of red phosphor 3 is prevented, and moisture is blocked therefrom, and the resulting effect is that a reaction between red phosphor 3 and moisture is suppressed so that generation of hydrofluoric acid is suppressed.

Coating resin 2a is a thermoplastic resin or a thermosetting resin.

Examples of the thermoplastic resin include general purpose plastics, such as polyethylene, polypropylene, and polystyrene, thermoplastic plastics, engineering plastics, heat-resistant engineering plastics, thermoplastic elastomer, such as those referred to as four major TPEs of styrene-butadiene type (TPS), olefin type (TPO), polyester type (TPEE), and polyurethane type (TPU), and those of vinyl chloride type (TPVC), polyamide type (TPEA), and fluorine rubber type, and silicone resin.

Examples of the thermosetting resin include: phenol resin, epoxy resin, urea resin, melamine resin, unsaturated polyester resin, polyurethane, and polyimide.

In the case where coating resin 2a coating the phosphor is a thermoplastic resin, the shape of the phosphor resin particles can be maintained even after a heating process.

The same material as that of embodiment 1 may be used as a material for red phosphor 3.

In the case where coating resin 2a coating red phosphor 3 is a thermoplastic resin, the thermoplastic resin is melted into sealing resin 2c when heated, and dispersed in sealing resin 2c. Thus, light-emitting device 53 is manufactured.

Moreover, the light-emitting device may be formed by using phosphor resin particles formed by coating green phosphor 7 and red phosphor 3 with a thermoplastic resin.

The same materials as those of embodiment 1 may be used as materials for light-emitting element 6 and sealing resin 2c.

The same material as that of embodiment 1 may be used as a material for green phosphor 7.

(Embodiment 5)

Figure 9:
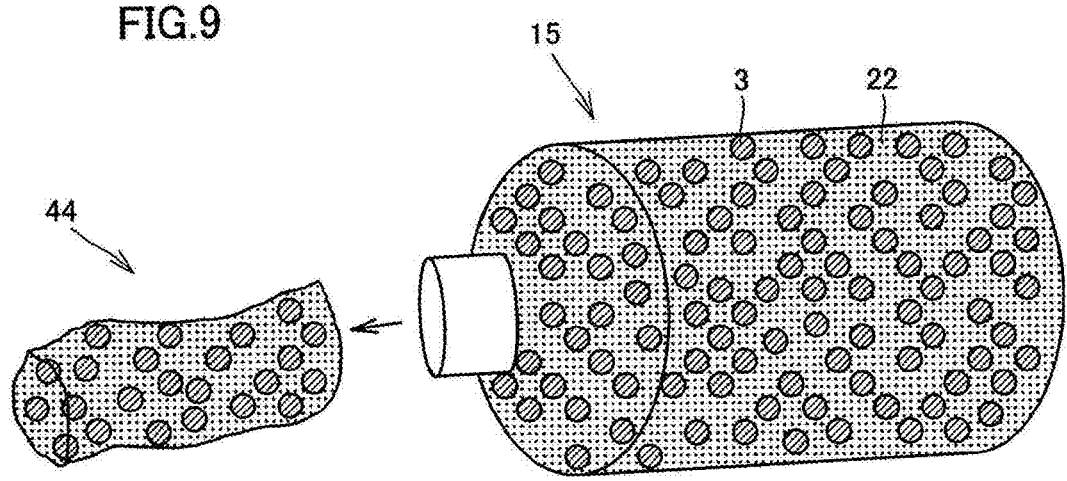
FIG. 9 is a schematic view that shows a phosphor kneaded matter packaging container and a phosphor kneaded matter containing a primer and a red phosphor used for manufacturing a light-emitting device in accordance with one embodiment of the present invention.
Figure 10:
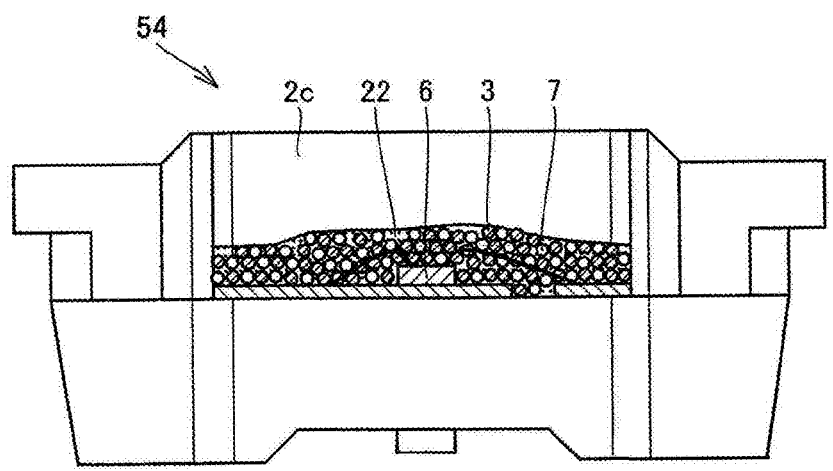
FIG. 10 is a cross-sectional view that shows a light-emitting device in accordance with the embodiment of the present invention.

Referring to FIGS. 9 and 10, the following description will discuss embodiment 5.

FIG. 9 is a schematic view that shows a phosphor kneaded matter packaging container 15 and a phosphor kneaded matter 44 containing a primer 22 and a red phosphor 3 to be used for manufacturing a light-emitting device in accordance with one embodiment of the present invention. FIG. 10 shows a light-emitting device in which a light-emitting element 6 is placed on a wiring pattern, with the wiring pattern and the upper portion of light-emitting element 6 being connected with each other by a bonding wire, and phosphor kneaded matter 44 containing primer 22 and red phosphor 3, obtained from phosphor kneaded matter packaging container 15, as well as a green phosphor 7 are sealed on the wiring pattern and light-emitting element 6 with sealing resin 2c.

Here, with respect to phosphor kneaded matter 44, red phosphor 3, formed by allowing red phosphor 3 to be coated with primer 22 in a tube, is taken out from phosphor kneaded matter packaging container 15 as phosphor kneaded matter 44 and used.

Since phosphor kneaded matter 44, produced by phosphor kneaded matter packaging container 15, is composed of primer 22 and red phosphor 3, scattering of red phosphor 3 is prevented, and moisture is blocked therefrom, and the resulting effect is that a reaction between red phosphor 3 and moisture is suppressed so that generation of hydrofluoric acid is suppressed.

Here, examples of primer 22 include: acryl-based primer, epoxy-based primer, silane-based primer, urethane-based primer, silicone-based primer and phenyl silicone-based primer. The presence of the primer layer makes it possible to improve the adhesion between the sealing resin and phosphor so that scattering of red phosphor 3 is prevented more effectively and blocking moisture therefrom is more effectively carried out, and the resulting effect is that a reaction between red phosphor 3 and moisture is suppressed so that generation of hydrofluoric acid is suppressed.

The same material as that of embodiment 1 may be used as a material for red phosphor 3.

A mixture, prepared by mixing green phosphor 7 and red phosphor 3 at a compounding ratio of 30:70 (weight ratio), is dispersed in a predetermined sealing resin (a ratio of the sealing resin and the phosphor is set to 1.00:0.25) so that a wavelength converting unit is formed. Thus, a light-emitting device 54 is manufactured.

The same materials as those of embodiment 1 may be used as materials for light-emitting element 6 and sealing resin 2c.

The same material as that of embodiment 1 may be used as green phosphor 7.

(Embodiment 6)

Figure 11:
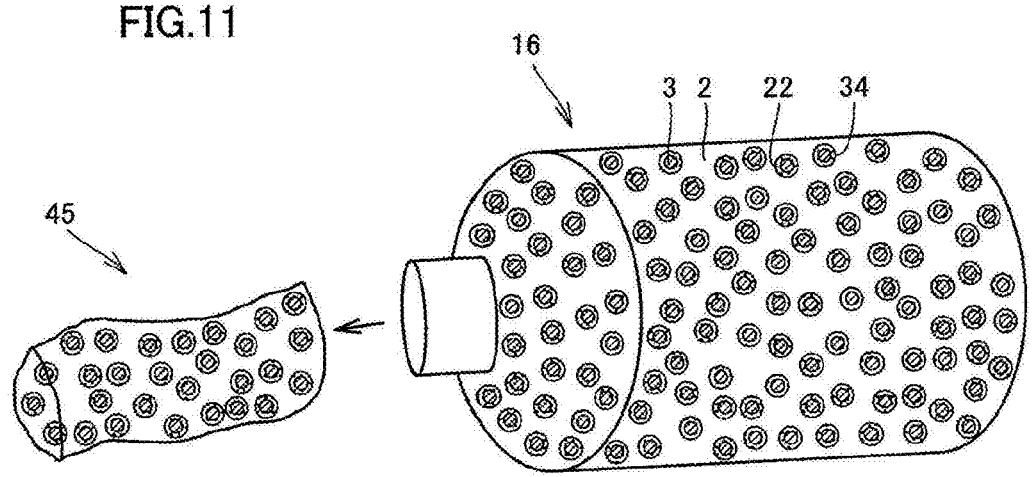
FIG. 11 is a schematic view that shows a phosphor kneaded matter packaging container and a phosphor kneaded matter containing a transparent resin and phosphor primer particles of a red phosphor covered with a primer used for manufacturing a light-emitting device in accordance with the embodiment of the present invention.
Figure 12:
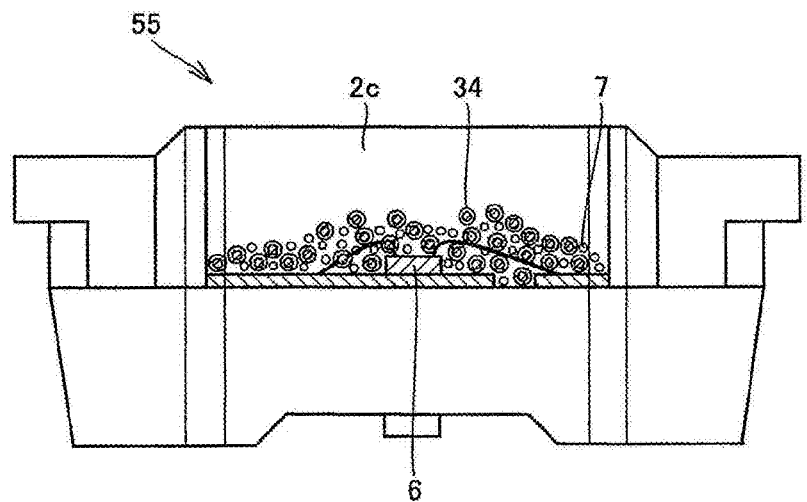
FIG. 12 is a cross-sectional view that shows a light-emitting device in accordance with the embodiment of the present invention.

Referring to FIGS. 11 and 12, the following description will discuss embodiment 6.

FIG. 11 is a schematic view that shows a phosphor kneaded matter packaging container 16 and a phosphor kneaded matter 45 containing phosphor primer particles 34 serving as a red phosphor 3 coated with a transparent resin 2 and a primer 22 that are used for manufacturing a light-emitting device in accordance with one embodiment of the present invention. FIG. 12 shows a light-emitting device 55 in which a light-emitting element 6 is placed on a wiring pattern, with the wiring pattern and the upper portion of light-emitting element 6 being connected with each other by a bonding wire, and phosphor kneaded matter 45 containing phosphor primer particles 34 serving as red phosphor 3 coated with sealing resin 2 and primer 22, obtained from phosphor kneaded matter packaging container 16, and green phosphor 7 are sealed on the wiring pattern and light-emitting element 6 by sealing resin 2c.

Green phosphor 7 and phosphor kneaded manner 45 containing red phosphor 3 are used for the wavelength converting unit. Phosphor kneaded matter 45 is taken out from phosphor kneaded matter packaging container 16 as a kneaded matter of phosphor primer particles 34 formed by coating the transparent resin and red phosphor 3 with primer 22 in a tube, and utilized.

The presence of the primer layer makes it possible to improve the adhesion between the transparent resin and phosphor and to more effectively block the phosphor from moisture, and the resulting effect is that a reaction with the moisture is suppressed so that generation of hydrofluoric acid is suppressed.

Since phosphor kneaded matter 45, generated from phosphor kneaded matter packaging container 16, is composed of phosphor primer particles 34 that are red phosphors 3 coated with transparent resin 2 and primer 22, scattering of red phosphor 3 is prevented, and moisture is blocked therefrom, and the resulting effect is that a reaction between red phosphor 3 and moisture is suppressed so that generation of hydrofluoric acid is suppressed.

Here, examples of primer 22 include: an acryl-based primer, an epoxy-based primer, a silane-based primer, a urethane-based primer, a silicone-based primer and a phenyl silicone-based primer.

The same material as that of embodiment 1 may be used as a material for red phosphor 3.

A mixed matter containing green phosphor 7 and red phosphor 3 at a compounding ratio of 30:70 (weight ratio) is dispersed in a predetermined sealing resin (a ratio of the sealing resin and the phosphor is set to 1.00:0.25) so that a wavelength converting unit is formed. Thus, light-emitting device 55 is manufactured.

Here, the light-emitting device may be manufactured by using phosphor primer particles in which green phosphor 7 and red phosphor 3 are coated with primer 22.

The same materials as those of embodiment 1 may be used as materials for light-emitting element 6 and sealing resin 2c.

The same materials as those of embodiment 1 may be used as materials for green phosphor 7.

(Embodiment 7)

Figure 13:
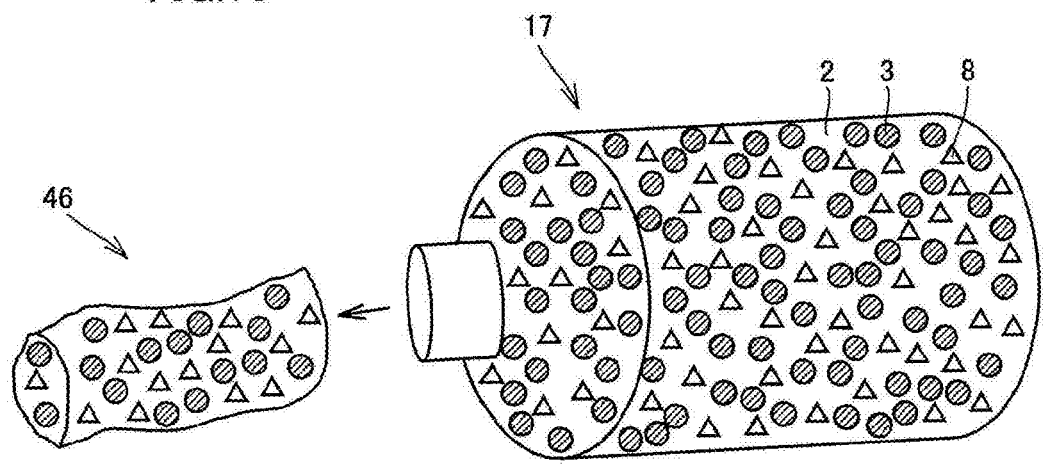
FIG. 13 is a schematic view that shows a phosphor kneaded matter packaging container and a phosphor kneaded matter containing a transparent resin, calcium gluconate and a red phosphor used for manufacturing a light-emitting device in accordance with one embodiment of the present invention.
Figure 14:
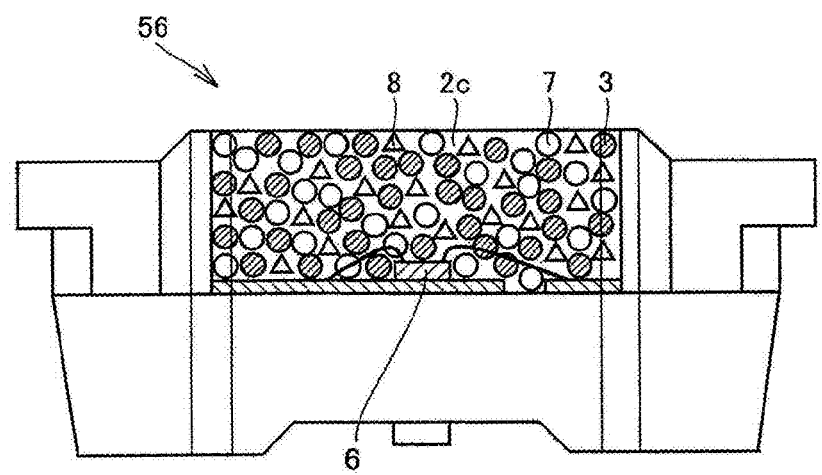
FIG. 14 is a cross-sectional view that shows a light-emitting device in accordance with the embodiment of the present invention.

Referring to FIGS. 13 and 14, the following description will discuss embodiment 7.

FIG. 13 is a schematic view that shows a phosphor kneaded matter packaging container 17 and a phosphor kneaded matter 46 containing a transparent resin 2, calcium gluconate 8 and a red phosphor 3 that are used for manufacturing a light-emitting device in accordance with one embodiment of the present invention. FIG. 14 shows a light-emitting device 56 in which a light-emitting element 6 is placed on a wiring pattern, with the wiring pattern and the upper portion of light-emitting element 6 being connected with each other by a bonding wire, and phosphor kneaded matter 46 containing transparent resin 2, calcium gluconate 8, and red phosphor 3, obtained from phosphor kneaded matter packaging container 17, as well as green phosphor 7 are sealed on the wiring pattern and light-emitting element 6 with sealing resin 2c.

Phosphor kneaded matter 46 containing calcium gluconate 8 and red phosphor 3 is used for a wavelength converting unit. Here, phosphor kneaded matter 46 is taken out of phosphor kneaded matter packaging container 17 through a tube 17 as a phosphor kneaded matter 46 in which red phosphor 3, transparent resin 2 and calcium gluconate 8 are kneaded with one another inside the tube and used.

Since phosphor kneaded matter 46, generated from phosphor kneaded matter packaging container 17, is composed of transparent resin 2, calcium gluconate 8 and red phosphor 3, scattering of red phosphor 3 is prevented, and moisture is blocked therefrom, and the resulting effect is that a reaction between red phosphor 3 and moisture is suppressed so that generation of hydrofluoric acid is suppressed.

Hydrogen fluoride causes a reaction in which it combines with calcium ions in the body to generate calcium fluoride, with the result that bones are damaged. When hydrofluoric acid that is thin in concentration adheres to a part of the body, an acute pain occurs several hours later. This is caused by an influence of calcium fluoride crystal that has been generated. Moreover, calcium ions in the blood are quickly consumed by hydrogen fluoride to cause a reduction in calcium concentration of the blood, often resulting in a serious hypocalcemia. Since the present embodiment has an effect for suppressing generation of hydrofluoric acid, it is possible to reduce the harmful influences to the human body.

Moreover, in the case where transparent resin 2 and red phosphor 3 are allowed to contain calcium gluconate 8 that is easily combined with hydrofluoric acid, and kneaded with one another, hydrofluoric acid, generated by a reaction between red phosphor 3 and moisture, is allowed to react with calcium gluconate 8 to exert an effect for preventing hydrofluoric acid from being discharged.

Here, calcium gluconate (molecular formula: $C_{12}H_{22}CaO_{14}.H_2O$) is white crystalline powder or granulated powder.

Gluconate has such a characteristic as to be easily absorbed by the body. Calcium ions taken into the body as gluconate are combined with soluble fluoride ions to form insoluble calcium fluoride so that the soluble fluoride ions are rendered innocuous.

Here, in the present embodiment, calcium gluconate is used; however, any calcium compound may be used as long as the compound is innocuous to a living body. Examples thereof include at least one compound selected from the group consisting of calcium borogluconate, calcium glycerophosphate, calcium chloride, calcium lactate, calcium propionate, calcium pantothenate, calcium citrate and calcium hydrogenphosphate. The above-mentioned calcium compounds can be used in the same manner as in calcium gluconate, and the same effects can be obtained.

The same materials as those of embodiment 1 may be used as materials for red phosphor 3 and transparent resin 2.

Here, the rate of calcium gluconate 8 is set to 30 to 50% in weight ratio relative to transparent resin 2.

A mixed matter containing green phosphor 7 and red phosphor 3 at a compounding ratio of 30:70 (weight ratio) is dispersed in a predetermined resin (ratio of resin 2 and the phosphor: 1.00:0.25) so that a wavelength converting unit is formed. Thus, light-emitting device 56 is manufactured.

The same materials as those of embodiment 1 may be used as materials for light-emitting element 6 and sealing resin 2c.

The same material as that of embodiment 1 may be used as a material for green phosphor 7.

(Embodiment 8)

Figure 15:
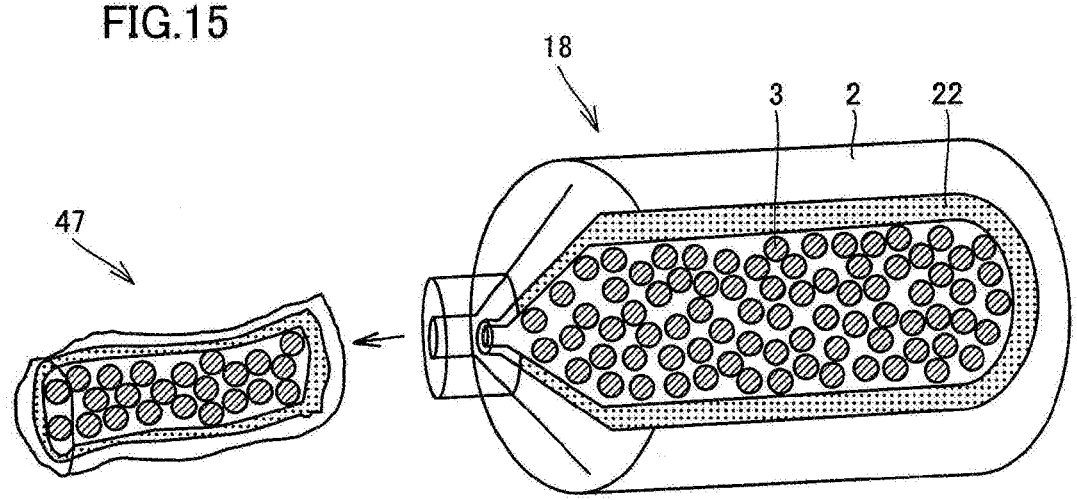
FIG. 15 is a schematic view that shows a phosphor kneaded matter packaging container and a phosphor kneaded matter having a three-layer structure containing a transparent resin, a primer and a red phosphor used for manufacturing a light-emitting device in accordance with one embodiment of the present invention.
Figure 16:
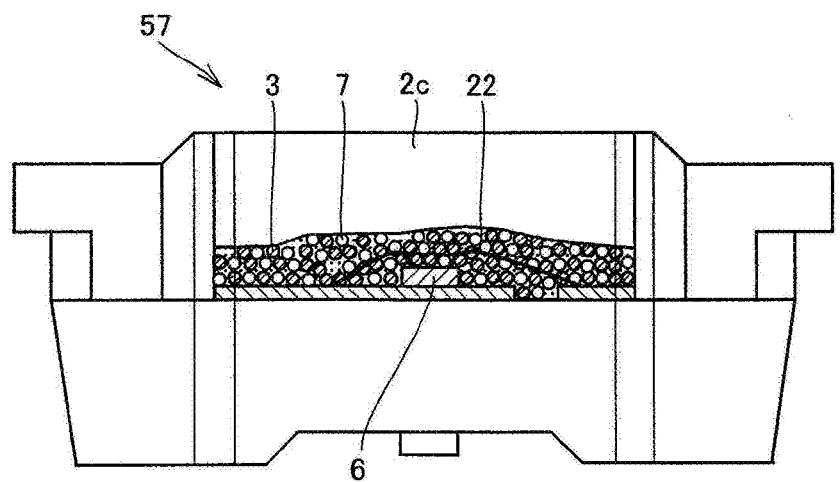
FIG. 16 is a cross-sectional view that shows a light-emitting device in accordance with the embodiment of the present invention.

Referring to FIGS. 15 and 16, the following description will discuss embodiment 8.

FIG. 15 is a schematic view that shows a phosphor kneaded matter packaging container 18 and a phosphor kneaded matter 47 having a three-layer structure containing a transparent resin 2, a primer 22, and a red phosphor 3 that are used for manufacturing a light-emitting device in accordance with one embodiment of the present invention. FIG. 16 shows a light-emitting device 57 in which a light-emitting element 6 is placed on a wiring pattern, with the wiring pattern and the upper portion of light-emitting element 6 being connected with each other by a bonding wire, and phosphor kneaded matter 47 containing transparent resin 2, primer 22, and red phosphor 3, obtained from phosphor kneaded matter packaging container 18, as well as green phosphor 7 are sealed on the wiring pattern and light-emitting element 6 by sealing resin 2c.

Green phosphor 7 and phosphor kneaded matter 47 containing red phosphor 3 are used for a wavelength converting unit. Here, phosphor kneaded matter 47 is taken out of phosphor kneaded matter packaging container 18 through a phosphor tube 18 as a phosphor kneaded matter prepared by coating red phosphor 3 with primer 22 and transparent resin 2 inside the tube and used.

Since phosphor kneaded matter 47, generated from phosphor kneaded matter packaging container 18, is composed of transparent resin 2 forming an outer layer, primer 22 forming an inner layer and red phosphor 3 located in the center, scattering of red phosphor 3 is prevented, and moisture is blocked therefrom, and the resulting effect is that a reaction between red phosphor 3 and moisture is suppressed so that generation of hydrofluoric acid is suppressed.

The same materials as those of embodiment 1 may be used as materials for red phosphor 3 and transparent resin 2.

The same material as that of embodiment 6 may be used as a material for primer 22.

A mixed matter containing green phosphor 7 and red phosphor 3 at a compounding ratio of 30:70 (weight ratio) is dispersed in a predetermined sealing resin (ratio of sealing resin and the phosphor: 1.00:0.25) so that a wavelength converting unit is formed. Thus, light-emitting device 57 is manufactured.

The same materials as those of embodiment 1 may be used as materials for light-emitting element 6 and sealing resin 2c.

The same material as that of embodiment 3 may be used as a material for green phosphor 7.

Here, any of the above-mentioned green phosphor and red phosphor to be used for the light-emitting device of the present embodiment are known phosphors, and can be manufactured by using a conventionally known method on demand, or can be obtained as commercial products.

EXAMPLES

Example 1

FIG. 1 shows a tube-shaped packaging container (made of polyethylene) in which a silicone resin serving as transparent resin 2 and $K_2(Ti_{0.99}Mn_{0.01})F_6$, that is, red fluoride phosphor serving as red phosphor 3, are kneaded in a tube.

A packaging container material forms phosphor kneaded matter packaging container 1 filled with phosphor kneaded matter 4 that causes a generation of hydrofluoric acid due to a reaction between the phosphor and moisture.

Since phosphor kneaded matter 4 has its red phosphor 3 coated with a silicone resin serving as transparent resin 2, scattering of red phosphor 3 is prevented, and moisture is blocked therefrom, and the resulting effect is that a reaction between red phosphor 3 and moisture is suppressed so that generation of hydrofluoric acid is suppressed.

By taking it into account that hydrofluoric acid is generated by a reaction between the phosphor and moisture, the packaging container material is prepared as polyethylene.

Next, light-emitting device 5 as shown in FIG. 2 was manufactured. A gallium nitride (GaN)-based semiconductor having a peak wavelength at 450 nm was used as light-emitting element 6, and phosphor kneaded matter 4 containing $Eu_{0.05}Si_{11.50}Al_{0.50}O_{0.05}N_{15.95}$ (β-type SiAlON) as green phosphor 7 and $K_2(Ti_{0.99}Mn_{0.01})F_6$ as red phosphor 3 was used as the wavelength converting unit. Here, a kneaded matter of transparent resin 2 and $K_2(Ti_{0.99}Mn_{0.01})F_6$ serving as red phosphor 3 was taken out of phosphor kneaded matter packaging container 1, and used as phosphor kneaded matter 4. A mixed matter containing green phosphor 7 and red phosphor 3 at a compounding ratio of 30:70 (weight ratio) was dispersed in sealing resin 2c made from epoxy resin (ratio of the sealing resin and the phosphor: 1.00:0.25) so that a wavelength converting unit was formed. Thus, a light-emitting device of embodiment 1 was manufactured.

Light-emitting devices obtained in example 1 were evaluated for brightness and color reproducibility (NTSC ratio). With respect to the brightness, each device was lit on under a forward current of (IF) 20 mA, and measurements were carried out by converting white light from the light-emitting device into photocurrent. Moreover, with respect to the color reproducibility (NTSC ratio), the manufactured light-emitting device was incorporated into a commercial LCD television display as its backlight light source, and measurements were carried out by using a Bm 5 made by Topcon Corporation so that the corresponding value was obtained. The color reproducibility (NTSC ratio) was remarkably improved to 86.4% to ensure that the device had desirable characteristics for backlights of middle and small-type LCDs.

Here, the NTSC ratio relates to a chromaticity diagram of XYZ colorimetric system of respective colors of red, green and blue, determined by NTSC (National Television System Committee), and chromaticity coordinates (x, y) respectively correspond to red (0.670, 0.330), green (0.210, 0.710) and blue (0.140, 0.080), and the NTSC ratio represents a ratio relative to a triangular area obtained by connecting the respective chromaticity coordinates of red, green and blue.

Figure 17:
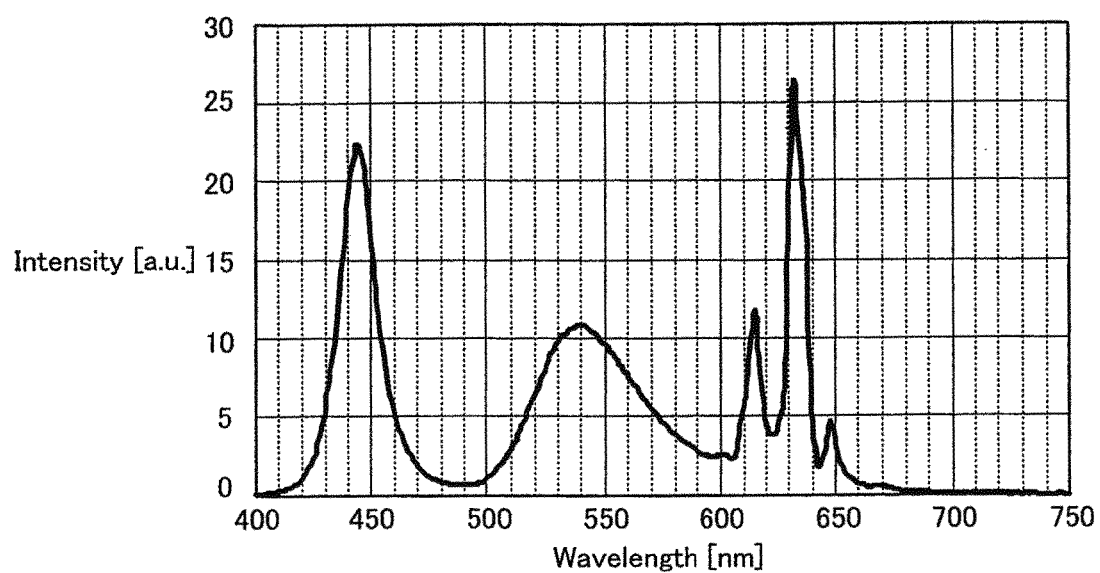
FIG. 17 is a graph that shows an emission spectrum distribution chart of the light-emitting device manufactured in example 1.
Figure 18:
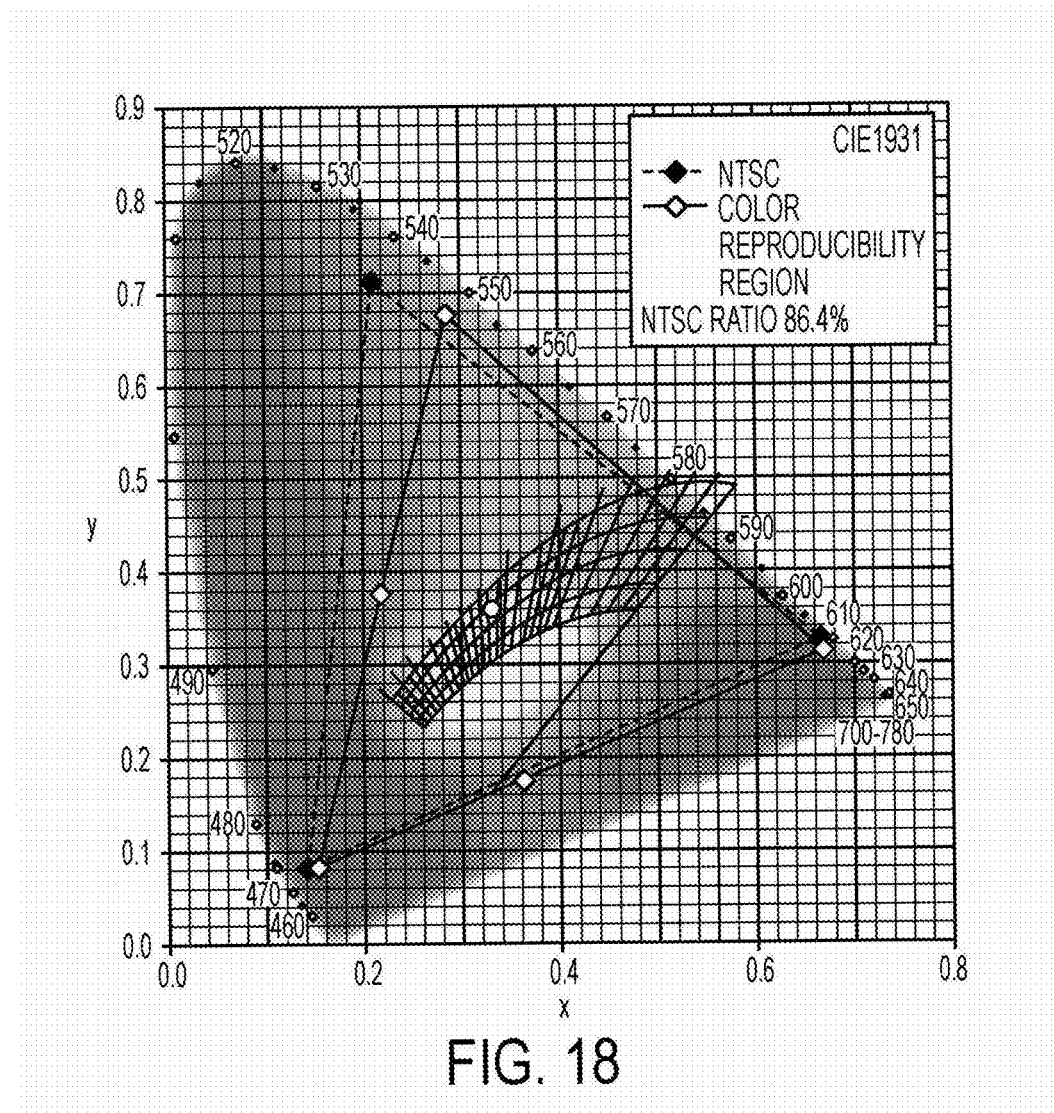
FIG. 18 is a chromaticity diagram that shows the color reproducibility of an LCD in which the light-emitting device manufactured in example 1 is incorporated as a backlight light source.
Figure 19:
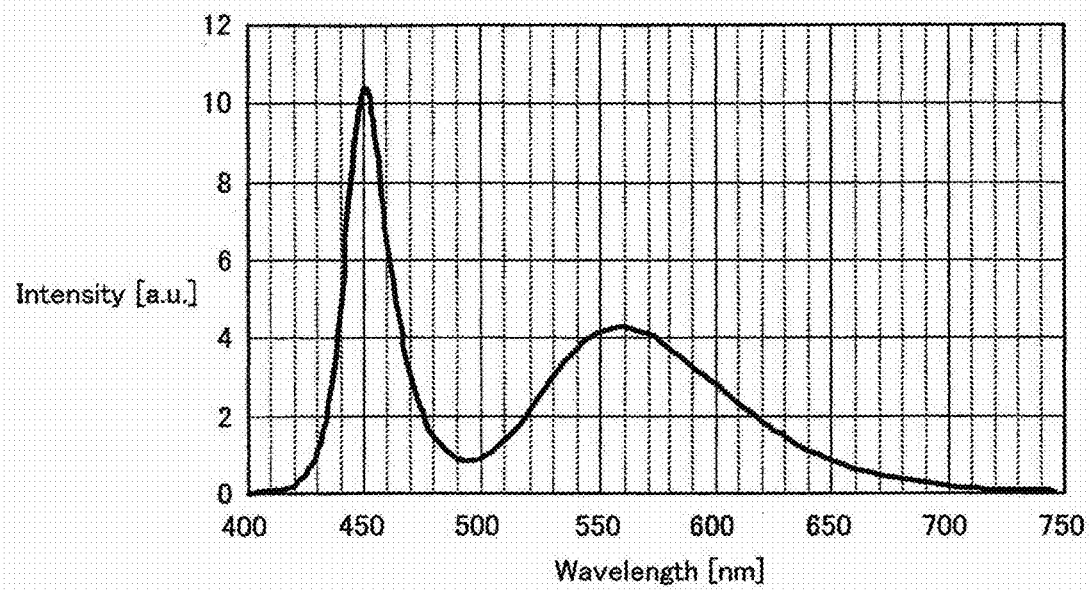
FIG. 19 is a graph that shows an emission spectrum distribution chart of a conventional light-emitting device.
Figure 20:
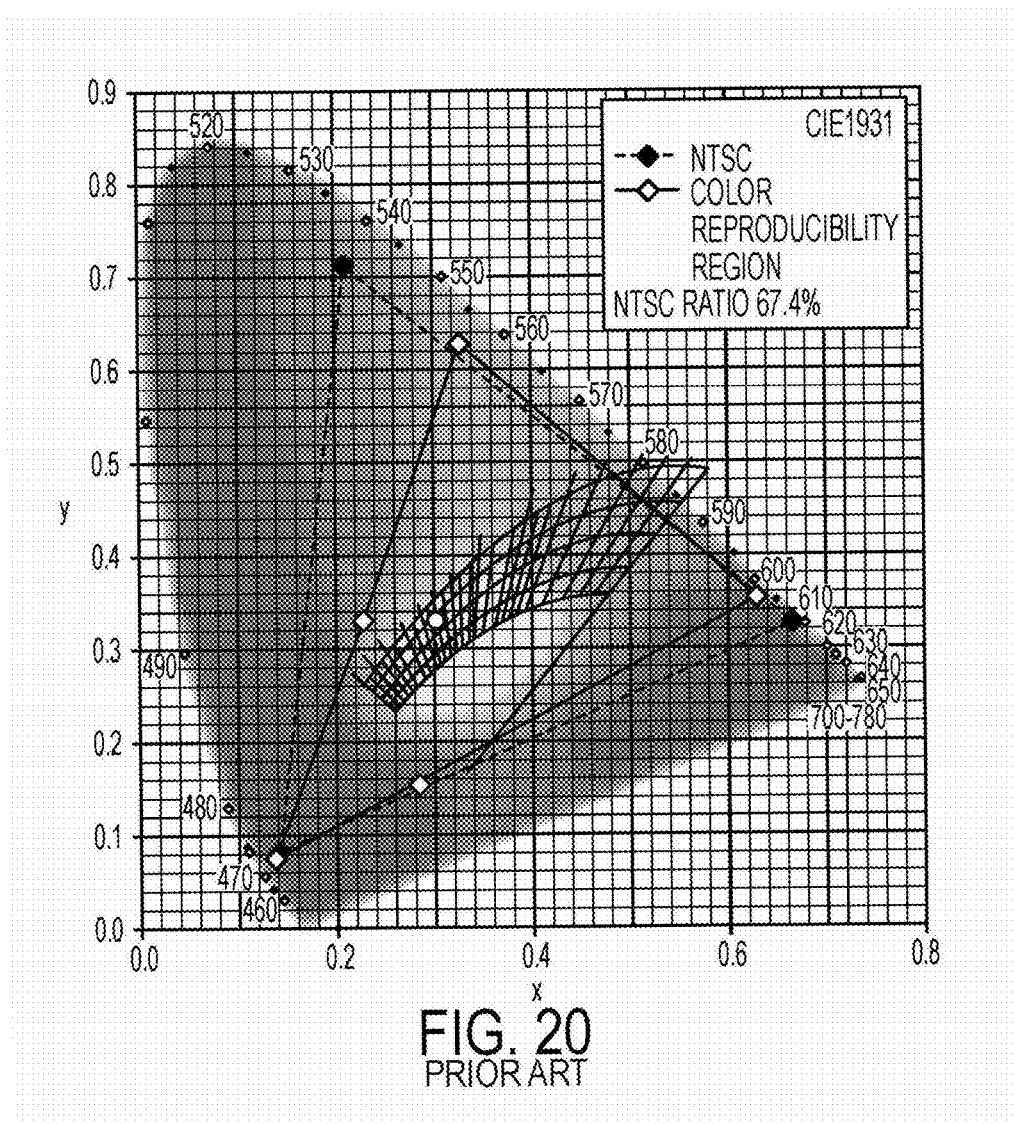
FIG. 20 is a chromaticity diagram that shows the color reproducibility of an LCD in which the conventional light-emitting device is incorporated as a backlight light source.

FIG. 17 is a graph that shows an emission spectrum distribution of a light-emitting device manufactured in example 1 of the present invention, and in FIG. 17, the axis of ordinate represents the intensity (arbitrary unit) and the axis of abscissa represents the wavelength (nm). Moreover, FIG. 18 is a chromaticity diagram (CIE1931) showing the color reproducibility of an LCD in which the light-emitting device manufactured in example 1 of the present invention is incorporated as a backlight light source. FIG. 19 is a graph that shows an emission spectrum distribution of a conventional light-emitting device (comparative example) in which yellow luminescent phosphor $((Y_{0.40}Gd_{0.45}Ce_{0.15})_3Al_5O_{12})$ is used, and FIG. 20 is a chromaticity diagram (CIE1931) showing the color reproducibility of an LCD in which this light-emitting device is incorporated as a backlight light source. Here, the emission spectrum distributions of the light-emitting devices shown in FIGS. 17 and 19 are based upon the results of measurements carried out by a MCPD-2000 (made by Otsuka Electronics Co., Ltd.). Moreover, the color reproducibility shown in each of FIGS. 18 and 20 is based upon the results of measurements carried out by a Bm5 (made by Topcon Corporation). As indicated by FIGS. 17 to 20, different from the conventional light-emitting device, the light-emitting device of the present invention allows the wavelength converting unit to effectively absorb light emission from a light-emitting element, and makes it possible to emit white light with high efficiency and also to provide white light that is remarkably superior in color reproducibility (NTSC ratio).

Example 2

FIG. 3 shows a phosphor kneaded matter packaging container 11 in which transparent resin 2 forming the packaging container outer layer is an epoxy resin and red phosphor 3 forms the packaging container inner layer, and a phosphor kneaded matter obtained from the container. Here, $K_2(Ti_{0.995}Mn_{0.005})F_6$ was used as red phosphor 3.

Next, a light-emitting device 51 as shown in FIG. 4 was manufactured. A gallium nitride (GaN)-based semiconductor having a peak wavelength at 440 nm was used as light-emitting element 6, and a phosphor kneaded matter 41 containing $2(Ba_{0.70}Sr_{0.26}Eu_{0.04}).SiO_2$ serving as green phosphor 7 and $K_2(Ti_{0.995}Mn_{0.005})F_6$ serving as red phosphor 3 was used as the wavelength converting unit. In this case, a phosphor kneaded matter 41, composed of red phosphor, $K_2(Ti_{0.995}Mn_{0.005})F_6$, coated with the epoxy resin serving as transparent resin 2, was taken out of phosphor kneaded matter packaging container 11, and used as phosphor kneaded matter 41.

A mixed matter containing green phosphor 7 and red phosphor 3 at a compounding ratio of 30:70 (weight ratio) was dispersed in sealing resin 2c made from epoxy resin (a ratio of the epoxy resin and the phosphor was 1.00:0.25) so that a wavelength converting unit was manufactured. Thus, a light-emitting device of example 2 was manufactured. With respect to the color reproducibility (NTSC ratio), the manufactured light-emitting device was incorporated into a commercial LCD television display as its backlight light source, and measurements were carried out by using a Bm 5 made by Topcon Corporation, and the corresponding value was obtained. The color reproducibility (NTSC ratio) was remarkably improved to 88.1% to ensure that the device had desirable characteristics for backlights of middle and small-type LCDs.

Example 3

FIG. 5 shows a phosphor kneaded matter packaging container 12 and a phosphor kneaded matter 42 that is formed by blending green phosphor 7 and red phosphor 3 at desired ratios in transparent resin 2 made from a silicone resin (ratio of transparent resin 2 and the phosphor: 1.00:0.25) inside the packaging container (made from polytetrafluoroethylene). In this case, $Eu_{0.30}Si_{9.80}Al_{2.20}O_{0.30}N_{15.70}$ was used phosphor 7 and $Na_2(Ti_{0.895}Zr_{0.100}Mn_{0.005})F_6$ was used as red phosphor 3.

Next, a light-emitting device 52 as shown in FIG. 6 was manufactured. A gallium nitride (GaN)-based semiconductor having a peak wavelength at 430 nm was used as light-emitting element 6, and phosphor kneaded matter 42 containing $Eu_{0.30}Si_{9.80}Al_{2.20}O_{0.30}N_{15.70}$ as green phosphor 7 and $Na_2(Ti_{0.895}Zr_{0.100}Mn_{0.005})F_6$ as red phosphor 3 at a ratio of 30:70 (weight ratio) was used as the wavelength converting unit. Here, a phosphor kneaded matter, formed by kneading $Eu_{0.30}Si_{9.80}Al_{2.20}O_{0.30}N_{15.70}$ and $Na_2(Ti_{0.895}Zr_{0.100}Mn_{0.005})F_6$ in a silicone resin inside the packaging container, was taken out of phosphor kneaded matter packaging container 12, and used as phosphor kneaded matter 42.

Phosphor kneaded matter 42 containing green phosphor 7 and red phosphor 3 at a compounding ratio of 30:70 (weight ratio) was preliminarily dispersed in sealing resin 2c made from silicone resin (ratio of the sealing resin and the phosphor: 1.00:0.25). Thus, a light-emitting device 52 of example 3 was manufactured.

With respect to the color reproducibility (NTSC ratio), the manufactured light-emitting device was incorporated into a commercial LCD television display as its backlight light source, and measurements were carried out by using a Bm 5 made by Topcon Corporation, and the corresponding value was obtained. The color reproducibility (NTSC ratio) was remarkably improved to 86.4% to ensure that the device had desirable characteristics for backlights of middle and small-type LCDs.

Example 4

FIG. 7 shows a phosphor kneaded matter packaging container 13 and a phosphor kneaded matter 43 prepared by kneading red phosphor 3 the entire surface of which is coated with transparent resin 2 made from a silicone resin and coating resin 2a made from a silicone resin inside the packaging container. In this case, $Cs_2(Ti_{0.790}Si_{0.200}Mn_{0.010})F_6$ was used as red phosphor 3.

Next, a light-emitting device 53 as shown in FIG. 8 was manufactured. A gallium nitride (GaN)-based semiconductor having a peak wavelength at 480 nm was used as light-emitting element 6, and a mixture, obtained by mixing $Eu_{0.15}Si_{10.00}Al_{2.00}O_{0.20}N_{15.80}$ as green phosphor 7 and $Cs_2(Ti_{0.790}Si_{0.200}Mn_{0.010})F_6$ obtained from phosphor kneaded matter 43 as red phosphor 3 at a ratio of 30:70 (weight ratio), was dispersed in a predetermined sealing resin 2c (ratio of the sealing resin and the phosphor: 1.00:0.25) so that a wavelength converting unit was formed. Here, with respect to phosphor kneaded matter 43, phosphor resin particles 31, made from $Cs_2(Ti_{0.790}Si_{0.200}Mn_{0.010})F_6$, that were coated with coating resin 2a made from silicone resin, were taken out of phosphor kneaded matter packaging container 11 as phosphor kneaded matter 43, and used.

Here, since coating resin 2a with which red phosphor 3 was coated was a thermoplastic resin, the resin was melted down into the sealing resin when heated, and dispersed in the resin. Thus, a light-emitting device 53 of example 4 was manufactured.

With respect to the color reproducibility (NTSC ratio), the manufactured light-emitting device was incorporated into a commercial LCD television display as its backlight light source, and measurements were carried out by using a Bm 5 made by Topcon Corporation, and the corresponding value was obtained. The color reproducibility (NTSC ratio) was remarkably improved to 87.9% to ensure that the device had desirable characteristics for backlights of middle and small-type LCDs.

Example 5

FIG. 9 shows a phosphor kneaded matter packaging container 15 and a phosphor kneaded matter 44 in which an acryl-based primer serving as primer 22 and red phosphor 3 are kneaded in the packaging container. Here, $Cs_2(Ti_{0.790}Si_{0.200}Mn_{0.010})F_6$ was used as red phosphor 3.

Next, a light-emitting device 54 as shown in FIG. 10 was manufactured. A gallium nitride (GaN)-based semiconductor having a peak wavelength at 455 nm was used as light-emitting element 6, and $2(Ba_{0.82}Sr_{0.15}Eu_{0.03})O \cdot SiO_2$ serving as green phosphor 7 and $Cs_2(Ti_{0.790}Si_{0.200}Mn_{0.010})F_6$ obtained from phosphor kneaded matter 44 as red phosphor 3 were used as the wavelength converting unit. In this case, as phosphor kneaded matter 44, a phosphor kneaded matter 44 in which $Cs_2(Ti_{0.790}Si_{0.200}Mn_{0.010})F_6$ serving as red phosphor 3 was coated with primer 22 was taken out of phosphor kneaded matter packaging container 15, and used.

These green phosphor 7 and red phosphor 3 were mixed at a compounding ratio of 30:70 (weight ratio), and the mixture was dispersed in sealing resin 2c (ratio of the sealing resin and the phosphor: 1.00:0.25) made from a predetermined silicone resin so that a wavelength converting unit was manufactured. Thus, a light-emitting device of example 5 was manufactured.

With respect to the color reproducibility (NTSC ratio), the manufactured light-emitting device was incorporated into a commercial LCD television display as its backlight light source, and measurements were carried out by using a Bm 5 made by Topcon Corporation, and the corresponding value was obtained. The color reproducibility (NTSC ratio) was remarkably improved to 88.5% to ensure that the device had desirable characteristics for backlights of middle and small-type LCDs.

Example 6

FIG. 11 shows a phosphor kneaded matter packaging container 16 and a phosphor kneaded matter that is made from transparent resin 2 and red phosphor 3 made of phosphor primer particles 34 coated with an acryl-based primer, and contained in the packaging container. In this case, $Ba(Ti_{0.990}Mn_{0.010})F_6$ was used as red phosphor 3.

Next, a light-emitting device 55 as shown in FIG. 12 was manufactured. A gallium nitride (GaN)-based semiconductor having a peak wavelength at 460 nm was used as light-emitting element 6, and $Eu_{0.01}Si_{11.60}Al_{0.40}O_{0.01}N_{15.99}$ serving as green phosphor 7 and $Ba(Ti_{0.990}Mn_{0.010})F_6$ obtained from phosphor kneaded matter 45 as red phosphor 3 were used as the wavelength converting unit. In this case, as phosphor kneaded matter 45, phosphor primer particles 34 formed by coating $Ba(Ti_{0.990}Mn_{0.010})F_6$ serving as red phosphor 3 with primer 22 were taken out of packaging container 16, and used.

These green phosphor 7 and red phosphor 3 were mixed at a compounding ratio of 30:70 (weight ratio), and the mixture was dispersed in sealing resin 2c made from silicone resin (ratio of the sealing resin and the phosphor: 1.00:0.25) so that a wavelength converting unit was manufactured. Thus, a light-emitting device of example 6 was manufactured.

With respect to the color reproducibility (NTSC ratio), the manufactured light-emitting device was incorporated into a commercial LCD television display as its backlight light source, and measurements were carried out by using a Bm 5 made by Topcon Corporation so that the corresponding value was obtained. The color reproducibility (NTSC ratio) was remarkably improved to 87.8% to ensure that the device had desirable characteristics for backlights of middle and small-type LCDs.

Example 7

FIG. 13 shows a phosphor kneaded matter packaging container 17 and a phosphor kneaded matter 46 in which silicone resin serving as transparent resin 2, calcium gluconate 8 (molecular formula: $C_{12}H_{22}CaO_{14} \cdot H_2O$) and red phosphor 3 are kneaded in the packaging container. Here, $(K_{0.80}Na_{0.20})_2(Ti_{0.690}Ge_{0.300}Mn_{0.010})F_6$ was used as red phosphor 3.

Next, a light-emitting device 56 as shown in FIG. 14 was manufactured. A gallium nitride (GaN)-based semiconductor having a peak wavelength at 445 nm was used as light-emitting element 6, and $2(Ba_{0.85}Sr_{0.10}Eu_{0.05})O \cdot SiO_2$ serving as green phosphor 7 and $(K_{0.80}Na_{0.20})_2(Ti_{0.690}Ge_{0.300}Mn_{0.010})F_6$ obtained from phosphor kneaded matter 46 as red phosphor 3 were used as the wavelength converting unit. Here, as phosphor kneaded matter 46, a phosphor kneaded matter 46 in which $(K_{0.80}Na_{0.20})_2(Ti_{0.690}Ge_{0.300}Mn_{0.010})F_6$ serving as red phosphor 3 was kneaded together with transparent resin 2 and calcium gluconate 8 was taken out of phosphor kneaded matter packaging container 17, and used.

The rate of calcium gluconate 8 was set to 30% in weight ratio relative to transparent resin 2.

These green phosphor 7 and red phosphor 3 were mixed at a compounding ratio of 30:70 (weight ratio), and the mixture was dispersed in transparent resin 2 made from silicone resin (ratio of transparent resin 2 and the phosphor: 1.00:0.25) so that a wavelength converting unit was manufactured. Thus, a light-emitting device of example 7 was manufactured.

With respect to the color reproducibility (NTSC ratio), the manufactured light-emitting device was incorporated into a commercial LCD television display as its backlight light source, and measurements were carried out by using a Bm 5 made by Topcon Corporation, and the corresponding value was obtained. The color reproducibility (NTSC ratio) was remarkably improved to 88.5% to ensure that the device had desirable characteristics for backlights of middle and small-type LCDs.

Example 8

FIG. 15 shows a phosphor kneaded matter packaging container 18 having a three-layer structure inside the packaging container and a phosphor kneaded matter having a layer made from primer 22 formed between transparent resin 2 and red phosphor 3. In this case, $Zn(Ti_{0.849}Sn_{0.150}Mn_{0.001})F_6$ was used as red phosphor 3.

Next, a light-emitting device 57 as shown in FIG. 16 was manufactured. A gallium nitride (GaN)-based semiconductor having a peak wavelength at 470 nm was used as light-emitting element 6, and $Eu_{0.005}Si_{11.70}Al_{0.30}O_{0.03}N_{15.97}$ serving as green phosphor 7 and $Zn(Ti_{0.849}Sn_{0.150}Mn_{0.001})F_6$ obtained from phosphor kneaded matter 47 as red phosphor 3 were used as the wavelength converting unit. Here, a phosphor kneaded matter in which $Zn(Ti_{0.849}Sn_{0.150}Mn_{0.001})F_6$ serving as red phosphor 3 was coated with primer 22 and transparent resin 2 was taken out of phosphor kneaded matter packaging container 18, and used as phosphor kneaded matter 47.

A mixed matter containing green phosphor 7 and red phosphor 3 at a compounding ratio of 30:70 (weight ratio) was dispersed in sealing resin 2c made from silicone resin (ratio of the sealing resin and the phosphor: 1.00:0.25) so that a wavelength converting unit was manufactured. Thus, a light-emitting device of example 8 was manufactured.

With respect to the color reproducibility (NTSC ratio), the manufactured light-emitting device was incorporated into a commercial LCD television display as its backlight light source, and measurements were carried out by using a Bm 5 made by Topcon Corporation, and the corresponding value was obtained. The color reproducibility (NTSC ratio) was remarkably improved to 88.4% to ensure that the device had desirable characteristics for backlights of middle and small-type LCDs.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A light-emitting device comprising:
a light-emitting element placed on a wiring pattern, with said wiring pattern and an upper portion of said light-emitting element being connected to each other by a bonding wire; and
a phosphor kneaded matter obtained from a phosphor kneaded matter packaging container, the phosphor kneaded matter comprising a transparent resin, a red phosphor, and a calcium compound,
wherein said phosphor kneaded matter is sealed on said wiring pattern and said light-emitting element by a sealing resin,
wherein said red phosphor is a tetravalent manganese-activated tetravalent fluoride metal salt phosphor,
wherein said calcium compound is calcium gluconate, calcium borogluconate, calcium glycerophosphate, calcium lactate, calcium propionate, calcium pantothenate, calcium citrate or calcium hydrogenphosphate, and
said calcium compound is 30 to 50% in weight ratio relative to the transparent resin.

2. The light-emitting device according to claim 1, wherein said phosphor kneaded matter is sealed together with a green phosphor by said sealing resin.

3. The light-emitting device according to claim 2, wherein said transparent resin contains at least one material selected from the group consisting of a dispersant, a reflective agent and a scattering agent.

4. The light-emitting device according to claim 1, wherein said phosphor kneaded matter contains a transparent resin, a red phosphor and a green phosphor.

5. The light-emitting device according to claim 1, wherein said phosphor kneaded matter contains a red phosphor coated with a transparent resin and a coating resin, and is sealed together with a green phosphor by said sealing resin.

6. The light-emitting device according to claim 1, wherein said phosphor kneaded matter contains a primer and a red phosphor, and is sealed together with a green phosphor by said sealing resin.

7. The light-emitting device according to claim 1, wherein said phosphor kneaded matter contains a red phosphor coated with a transparent resin and a primer, and is sealed together with a green phosphor by said sealing resin.

8. The light-emitting device according to claim 1, wherein said phosphor kneaded matter contains a transparent resin, a red phosphor and a green phosphor coated with a primer.

9. The light-emitting device according to claim 1, wherein uppermost layers of a pad electrode, a bonding wire and a wiring pattern on a light-emitting element that are made in contact with the sealing resin that seals said phosphor kneaded matter are made of a platinum layer or a gold layer.

10. The light-emitting device according to claim 1, wherein said phosphor kneaded matter packaging container and said phosphor kneaded matter are made in contact with each other, with a contact face of said kneaded matter packaging container being made from a polymer material.

11. The light-emitting device according to claim 1, wherein said phosphor kneaded matter packaging container is a tube-shaped tube packaging container or a tube-shaped container.

12. The light-emitting device according to claim 1, wherein said phosphor kneaded matter packaging container further includes a calcium compound therein.

13. A method for manufacturing the light-emitting device according to claim 1, in which a light-emitting element is placed on a wiring pattern, with said wiring pattern and an upper portion of said light-emitting element being connected with each other by a bonding wire, comprising the step of:
sealing a phosphor kneaded matter obtained from a phosphor kneaded matter packaging container on said wiring pattern and said light-emitting element by using a sealing resin.

* * * * *